(12) United States Patent
Lin

(10) Patent No.: US 9,281,417 B1
(45) Date of Patent: Mar. 8, 2016

(54) GAN-BASED SCHOTTKY DIODE HAVING LARGE BOND PADS AND REDUCED CONTACT RESISTANCE

(71) Applicant: Vishay General Semiconductor LLC, Hauppauge, NY (US)

(72) Inventor: Yih-Yin Lin, Taipei (TW)

(73) Assignee: VISHAY GENERAL SEMICONDUCTOR LLC, Hauppauge, NY (US)

( * ) Notice: Subject to any disclaimer, the term of this patent is extended or adjusted under 35 U.S.C. 154(b) by 0 days.

(21) Appl. No.: 14/627,013

(22) Filed: Feb. 20, 2015

(51) Int. Cl.
| | |
|---|---|
| H01L 27/15 | (2006.01) |
| H01L 31/12 | (2006.01) |
| H01L 29/872 | (2006.01) |
| H01L 29/20 | (2006.01) |
| H01L 29/205 | (2006.01) |
| H01L 29/417 | (2006.01) |
| H01L 29/06 | (2006.01) |

(52) U.S. Cl.
CPC .......... *H01L 29/872* (2013.01); *H01L 29/0684* (2013.01); *H01L 29/2003* (2013.01); *H01L 29/205* (2013.01); *H01L 29/417* (2013.01)

(58) Field of Classification Search
USPC ........................................................ 257/76
See application file for complete search history.

(56) References Cited

U.S. PATENT DOCUMENTS

| | | | | |
|---|---|---|---|---|
| 5,614,762 A * | 3/1997 | Kanamori | ......... | H01L 21/28587 257/280 |
| 6,114,732 A * | 9/2000 | Sugimura | ......... | H01L 29/41758 257/365 |
| 6,159,841 A * | 12/2000 | Williams | ............ | H01L 23/4824 257/E23.015 |
| 6,765,268 B2 * | 7/2004 | Akamine | ............ | H01L 23/4824 257/368 |
| 6,767,779 B2 * | 7/2004 | Parker | ................. | H01L 29/0692 257/E21.427 |
| 7,145,071 B2 * | 12/2006 | Spivack | ............... | H01G 9/2027 136/252 |
| 7,417,257 B2 * | 8/2008 | Beach | ................. | H01L 29/0692 257/79 |
| 2003/0080294 A1 * | 5/2003 | Matocha | ................... | G01J 1/42 250/339.15 |
| 2010/0182073 A1 | 7/2010 | Daumiller et al. | | |

* cited by examiner

*Primary Examiner* — Thao P Le
(74) *Attorney, Agent, or Firm* — Stuart H. Mayer; Mayer & Williams PC (57) ABSTRACT

A semiconductor device includes a first active layer disposed over a substrate. The second active layer is disposed on the first active layer. The second active layer has a higher bandgap than the first active layer such that a two-dimensional electron gas layer arises between the first active layer and the second active layer. The first electrode establishes a Schottky junction with the second active layer. The first electrode includes a first electrode pad and a first series of fingers in electrical contact with the first electrode pad. The second electrode establishes an ohmic junction with the first active layer. The second electrode includes a second electrode pad and a second series of fingers in electrical contact with the second electrode pad. The first and second series of electrode fingers form an interdigitated pattern. The first electrode pad is located over the first and second series of electrode fingers.

14 Claims, 7 Drawing Sheets

GAN-BASED SCHOTTKY DIODE HAVING LARGE BOND PADS AND REDUCED CONTACT RESISTANCE

BACKGROUND

A Schottky diode is a semiconductor device formed by a metal contacting a semiconductor layer. The junction between the metal and the semiconductor layer forms a rectifying junction with improved diode switching capability as compared to p-n junction diodes formed entirely in a semiconductor layer. Schottky diodes thus have lower turn-on voltages and faster switching speeds as compared to p-n junction diodes. Schottky diodes are ideal for applications where switching loss is the major source of energy consumption, such as inswitch-mode power supplies (SMPS).

Electronic devices made from nitride-based compound semiconductor materials are known. Such electronic devices are also known as III-nitride semiconductor devices are formed from Group III nitride based materials. Nitride-based compound semiconductor devices are desirable for their wider band gap and higher breakdown voltage characteristics, rendering them suitable for high voltage and high temperature applications. In particular, III-V gallium nitride (GaN) compound semiconductor Schottky diodes having a high breakdown voltage and a low on-resistance have been described. The efficiency of switch-mode power supplies can be improved through the use of III-nitride semiconductor Schottky barrier diodes.

III-nitride based semiconductor devices are capable of maximizing electron mobility by forming a 2-dimensional electron gas at the hetero-interface of two different III-nitrides such as AlGaN and GaN. The 2-dimensional electron gas is believed to compensate for the strain-induced piezoelectric polarization charges and spontaneous polarization charges arising from the non-ideal nature of the III-nitride crystal structure. The 2-dimensional electron gas is quantum-confined in the band bending region of a hetero junction where a narrower bandgap III-nitride (e.g., GaN) joins a larger bandgap III-nitride (e.g., AlGaN). Thus in a Schottky-like diode, electrons will flow along a confined channel between the anode electrode and the cathode electrode. The charge density is determined by hetero-structure parameters such as the Al composition, AlGaN layer thickness, and inherent crystal polarity. In III-nitride power devices, the charge density will respond to the applied gate voltage and can be removed locally according to changes in the energy band gaps. Therefore, the switching speed of III-nitride power devices can be very rapid.

Figure 1:
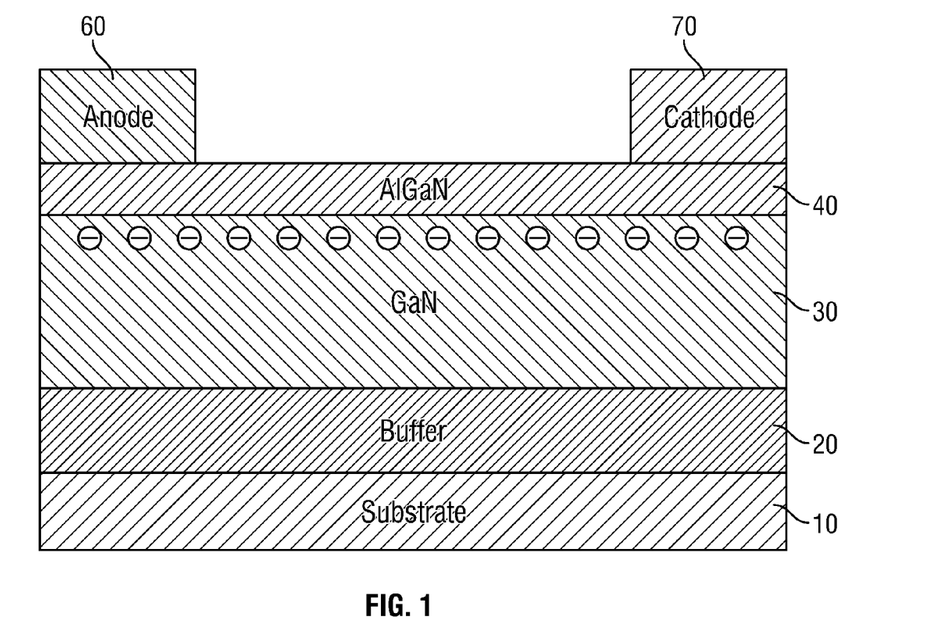
FIG. 1 shows an example of a GaN-based Schottky diode.

FIG. 1 shows an example of a GaN-based Schottky diode. The diode 100 includes a substrate 10, a buffer layer 20, a GaN layer 30 formed on the buffer layer 20 and an AlGaN layer 40 formed on the GaN layer 30. A two-dimensional conductive channel arises at the interface between the GaN layer 30 and the AlGaN layer 40. An anode 60 and cathode 70 serve as electrical contacts for the device. The anode 60 is formed on the AlGaN layer 40 and establishes a Schottky interface therewith. The cathode 70 is formed on the AlGaN layer 40 and establishes an ohmic contact therewith.

One problem with the simple Schottky diode configuration shown in FIG. 1 is that it is impractical for high current applications because its conducting length is insufficient. To operate at high current levels, the overall device dimensions would have to be increased substantially. This is because the forward current of AlGaN/GaN Schottky diodes is proportional to the total Schottky gate length. Thus, in order for a 20 mA/mm GaN SBD to carry 1 A current, for instance, the Schottky gate length would have to be 500 mm, which is simply unrealistic the design of power devices.

One common approach that is used to increase the total Schottky gate length is to form finger-shaped electrodes. In this approach the ohmic contacts of the cathode are interdigitated with the finger-shaped electrodes of the Schottky contacts. This alternating pattern of contacts can be repeated any desired number of times to increase the length of the electrodes. The Schottky electrodes are all electrically connected to an anode bond pad and the ohmic contacts are all electrically connected to a cathode bond pad. The bond pads are to used establish wire-bond connections to the device. However, if the size of the bond pads is not sufficiently large multiple thin wires may have to be used to bear the large currents that are to be carried. In addition to increasing the contact resistance, the use of multiple thin wires increases material costs and the assembly time. On the other hand, if the bond pads are increased in size to accommodate thicker wires, the die size has to be increased and the cost of a single die will increase by a corresponding amount. For flip-chip and solder-joint packages in particular, such a layout results in an inefficient use of the overall chip area.

SUMMARY

In accordance with one aspect of the disclosure, a semiconductor device includes a substrate, first and second active layers and first and second electrodes. The first active layer is disposed over the substrate. The second active layer is disposed on the first active layer. The second active layer has a higher bandgap than the first active layer such that a two-dimensional electron gas layer arises between the first active layer and the second active layer. The first electrode establishes a Schottky junction with the second active layer. The first electrode includes a first electrode pad and a first series of fingers in electrical contact with the first electrode pad. The second electrode establishes an ohmic junction with the first active layer. The second electrode includes a second electrode pad and a second series of fingers in electrical contact with the second electrode pad. The first and second series of electrode fingers form an interdigitated pattern. The first electrode pad is located over the first and second series of electrode fingers.

DETAILED DESCRIPTION

As detailed below, a layout is provided which can improve the heat distribution and conducting resistance for lateral power diodes, such as III-nitride based diodes. The layout includes a first bond pad (e.g., anode) enclosing a second bond pad (e.g., cathode) and the two pads are of different polarity. All electrodes (Schottky and Ohmic) may be embedded under the first pad area but only the electrodes of the first polarity (Schottky) are connected to the top of first pad. Electrodes of the second polarity (Ohmic) extend to the second pad area and are connected to the top of second pad. The two types of electrodes are isolated by dielectric materials such as $SiO_2$, $SiN_x$, or $Al_2O_3$. This design can relieve the electrical stress by shortening the current conducting path and an even thermal distribution, and more the design does not require additional bond pad area. This layout may be fully compatible with wire-bond, flip-chip, and solder-joint packages.

Figure 2:
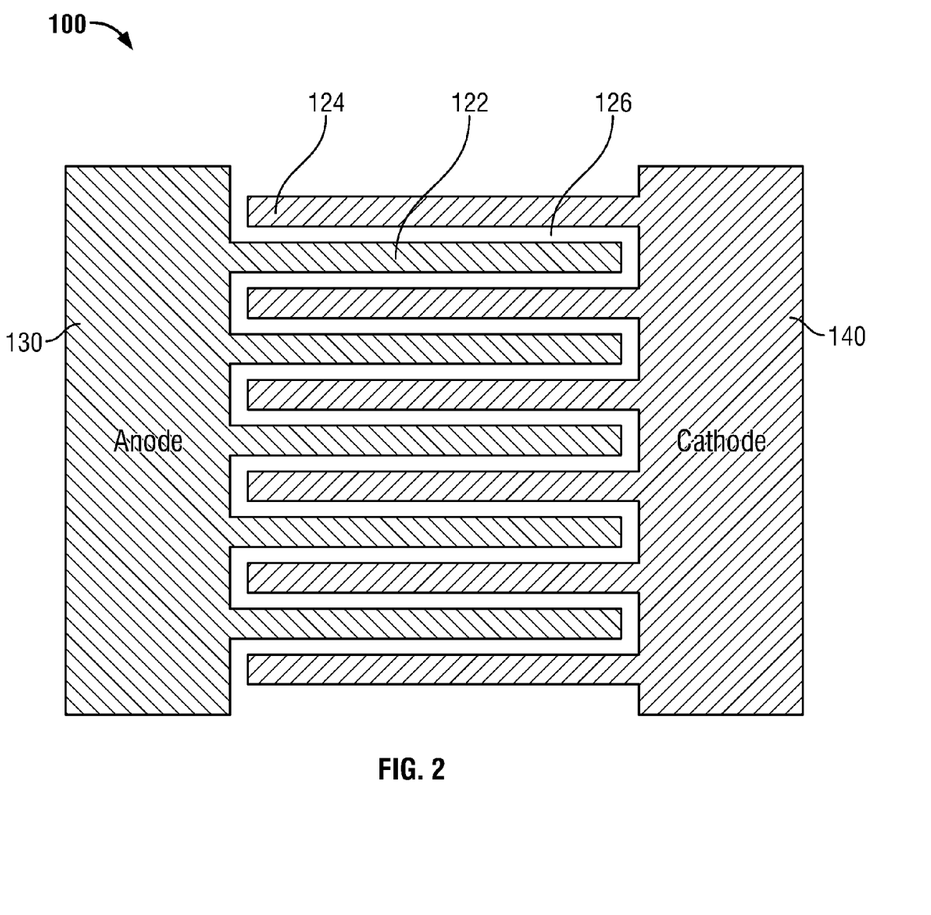
FIG. 2 shows a plan view of a GaN-based Schottky diode that employs interdigitated electrodes.

A plan view of a GaN-based Schottky diode 100 that employs interdigitated electrodes is shown in FIG. 2. Schottky diode 100 has interdigitated portions of an anode electrode 122 and a cathode electrode 124 extending between and alternating with each other. A dielectric 126 is formed in a serpentine shape between interdigitated portions of anode electrode 122 and cathode electrodes 124. The interdigitated portions of the anode electrode 122 are electrically coupled to anode pad 130 and the interdigitated portions of the cathode electrode 124 are electrically connected to the cathode bond pad 140. The anode pad 130 and cathode pad 140 are disposed on opposite sides of the interdigitated portions of the electrodes 122 and 124.

As previously mentioned, if the bond pads such as anode pad 130 and cathode pad 140 are sufficiently large to accommodate thick wires the size and cost of the diode will be relatively large. To address this problem, in accordance with one embodiment, the anode pad is placed over the interdigitated portions of the electrodes 122 and 124 instead of placing it off the side as in FIG. 1. In this way carriers from the anode pad are directly and simultaneously injected into the interdigitated portions of the anode electrode. The ohmic region, including both the cathode pad and the interdigitated portions of the cathode electrode, is passivated by dielectric materials and isolated from the anode pad so that the carriers will not also be injected into the ohmic layer at the same time they are injected into the interdigitated portions of the anode electrode.

Figure 3:
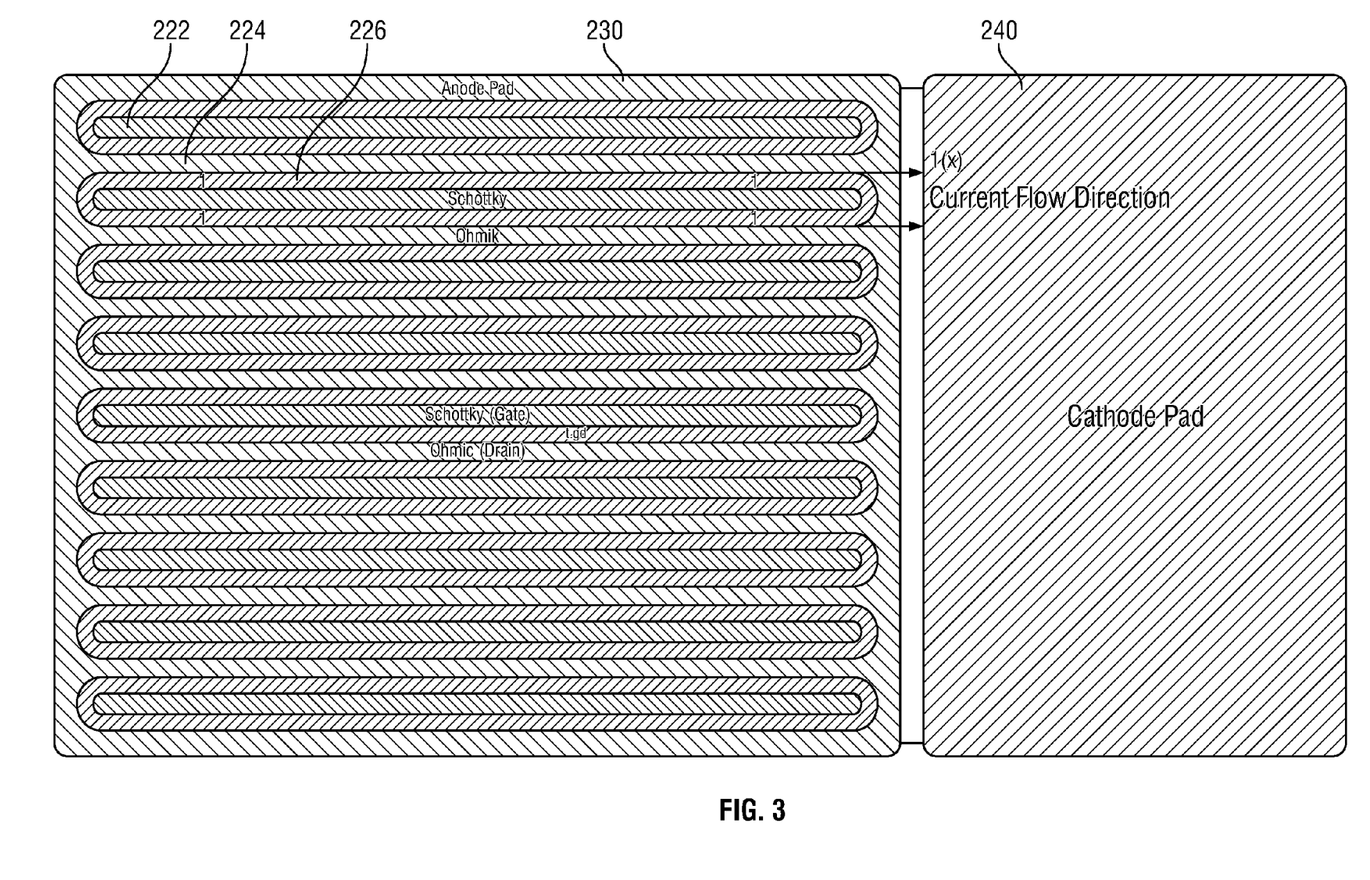
FIG. 3 shows a plan view of a GaN-based Schottky diode in which the anode pad is placed over the interdigitated portions of the electrodes.

An example of an embodiment in which the anode pad 230 is placed over the interdigitated portions of the electrodes is shown in FIG. 3. For clarity, in this example the interdigitated portions of the electrodes are visible through the overlying anode pad 230. As indicated by the arrows, the injected carriers flow from the interdigitated portions 222 of the anode electrode and through the AlGaN barrier. The carriers then traverse the 2D channel to the interdigitated portions 224 of the cathode electrode. The carriers then flow as indicated by arrow through the interdigitated portions 224 of the cathode electrode to the cathode pad 240.

One problem with the layout shown in FIG. 3 is that if the anode pad is placed on top of the interdigitated portions of the cathode electrode without also changing the placement of the cathode pad is that the far end of the anode edge (closest to the cathode) will experience the highest electrical stress. This will result in a relatively high resistance that will need to be reduced for many applications.

Figure 4:
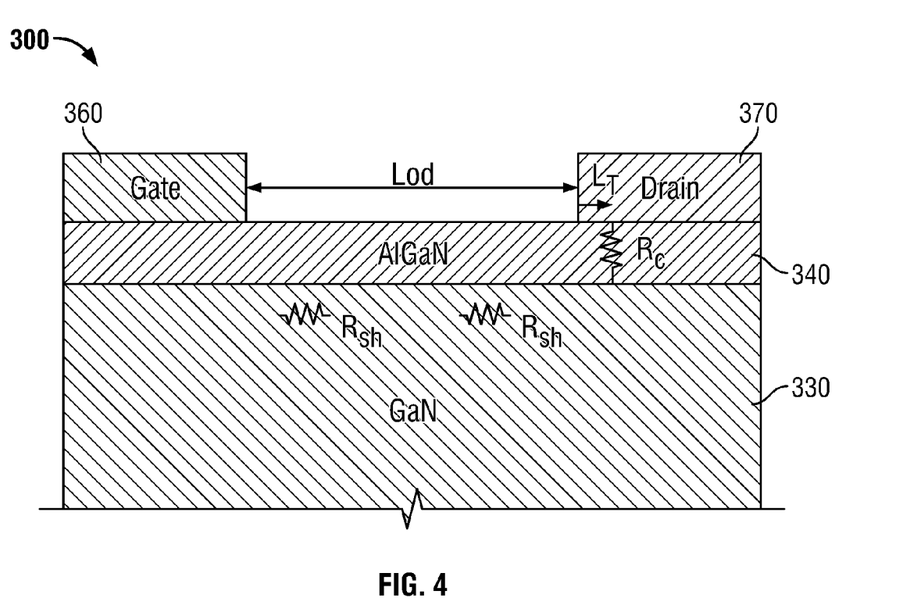
FIG. 4 is a partial, cross-sectional view of a GaN-based Schottky diode.

The resistance can be estimated with reference to the partial, cross-sectional view of the GaN-based Schottky diode shown in FIG. 4. The diode 300 includes a GaN layer 330 and an AlGaN layer 340 formed on the GaN layer 330. A two-dimensional conductive channel arises at the interface between the GaN layer 330 and the AlGaN layer 340. An anode 360 and cathode 370 serve as electrical contacts for the device 300. The anode 360, referred to in FIG. 4 as the gate, is formed on the AlGaN layer 340 and establishes a Schottky interface therewith. The cathode 370, referred to in FIG. 4 as the drain, is formed on the GaN layer 330 and establishes an ohmic contact therewith.

To estimate the resistance a small segment of the carrier transport path is shown in FIG. 4 when the device is under a forward bias. To simplify the analysis, assume that the contact resistance is simply $R_c$ (between metal and semiconductor) and neglect the metal resistance (which is small) and the contact resistance of the gate (since carriers cross the gate by thermal emission/tunneling). The total resistance for such a configuration is then $$R = R_{sp} + R_c = R_{sh}\frac{L_T + L_{gd}}{W} + R_c$$

where $R_{sh}$ is the sheet resistance of the 2DEG channel, W is the contact width, Lgd is the gate to drain distance and Lt is the transfer length, which is the average distance that an electron (or hole) travels in the semiconductor region beneath the contact before it flows up into the contact.

Referring again to FIG. 3, assuming the carriers travel the shortest route, once they cross the Schottky barrier they flow to the interdigitated portions 224 of the cathode electrode and move toward the cathode pad. Those carriers which travel the greatest distance in the ohmic region will experience the highest resistance. That is, the carriers experiencing the highest resistance are those carriers which are injected into the interdigitated portions 224 of the cathode electrode from the leftmost side of the device in FIG. 3. Moreover, the edge of the anode pad 230 closest to the cathode pad 240 will bear the largest electrical stress and the highest thermal energy.

Both of the aforementioned problems concerning the resistance and the electrical stress can be ameliorated by shortening the carrier path in the ohmic region. The resistance of the interdigitated portions of the cathode electrode underlying the anode pad region is proportional to the carrier path length l(x) traversed by the carriers and inversely proportional to the product of the total conducting area A, i.e. the area of the interdigitated portions of the cathode electrode underlying the anode pad and the Ohmic metal thickness t. The overall resistance will be the integral of the resistance in each interdigitated portion of the cathode electrode taken in parallel. To simplify, the total resistance, $R_{total}$ is i proportional to l(x)t/A.

Figure 5A:
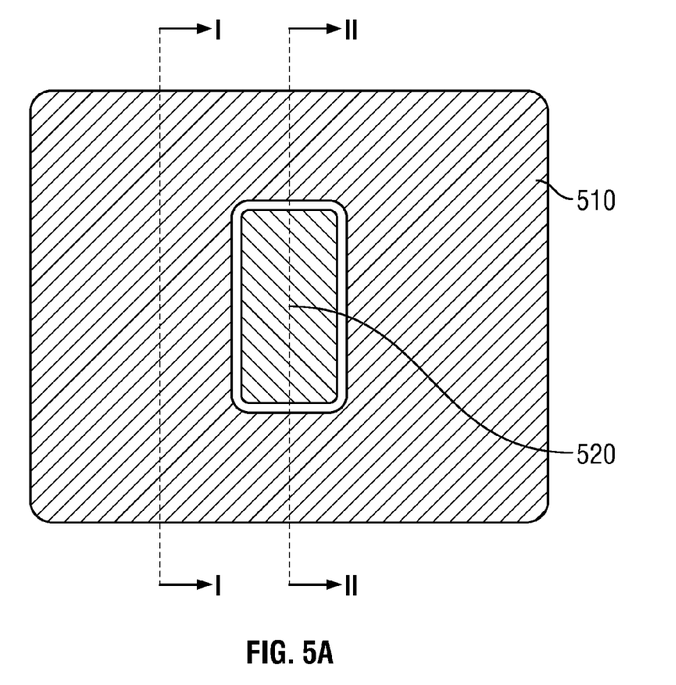
FIG. 5a shows a plan view of GaN-based Schottky diode in which the cathode pad is centrally located.
Figure 5B:
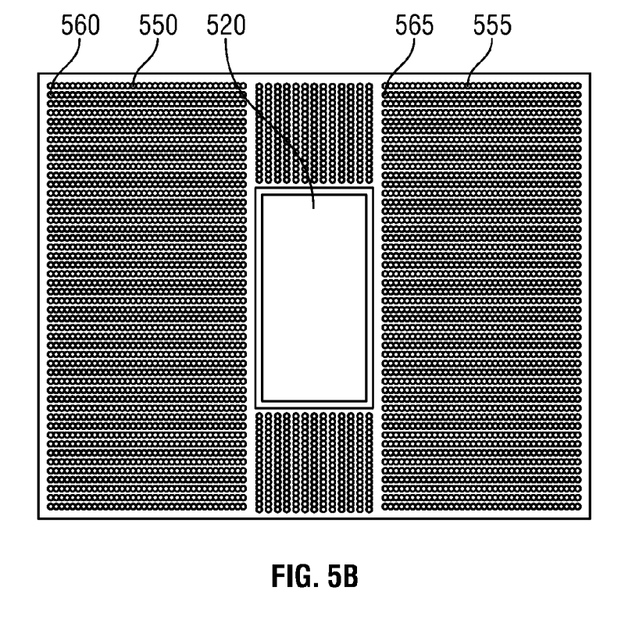
FIG. 5b shows a plan view of GaN-based Schottky diode with the anode removed so that the underlying finger electrodes are visible.

In one embodiment, the carrier path in the ohmic region may be reduced by modifying the layout arrangement shown in FIG. 3 so that the cathode pad is located in the center of the die and is surrounded by the anode pad. In this way the distance traveled by the carriers in the ohmic region can be reduced, and the electrical stress can be distributed evenly around the cathode. One example of such an arrangement 500 is shown in FIGS. 5a and 5b. FIG. 5a shows both the anode pad 510 and the cathode pad 520 and FIG. 5b shows the arrangement with the anode pad removed so that the underlying interdigitated portions 550 of the electrodes are visible.

As shown, the interdigitated portions of the electrodes underlying the anode pad 510 include a first plurality 550 of anode electrode fingers located on a first side of the centrally located cathode pad 520 and a second plurality 555 of anode electrode fingers located on a second side of the cathode pad 520, where the first and second sides of the cathode pad oppose one another. In addition, the first and second plurality of anode electrode fingers are parallel to one another. Likewise, a first plurality 560 of cathode electrode fingers are located on the first side of the cathode pad 520 and a second plurality 565 of cathode electrode fingers are located on the second side of the cathode pad 520. The first plurality of anode electrode fingers are interlaced with the first plurality of cathode electrode fingers and the second plurality of anode electrode fingers are interlaced with the second plurality of cathode electrode fingers. A dielectric is formed between the interlaced fingers in the first and second plurality of electrode fingers.

Figure 6:
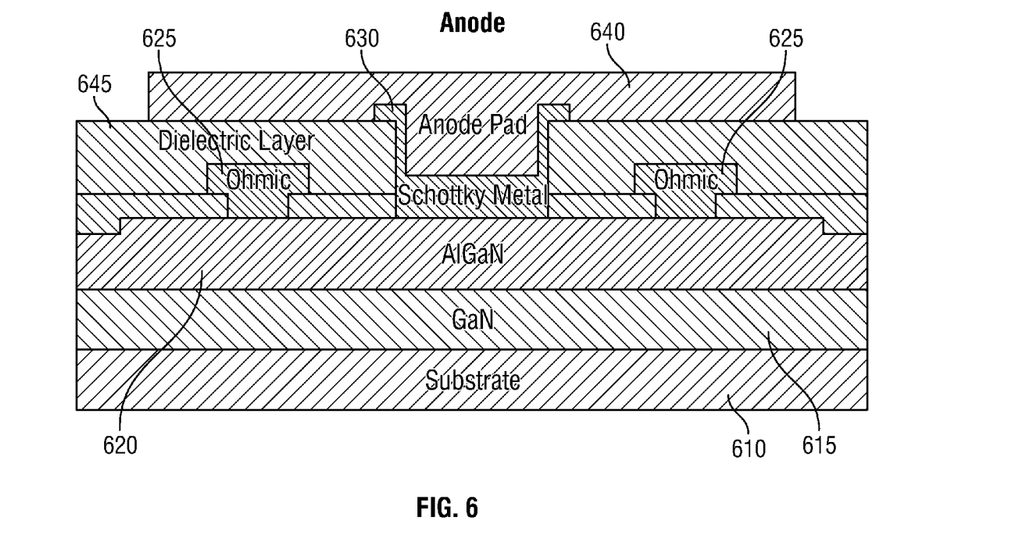
FIG. 6 is a cross-sectional view of the diode shown in FIG. 5 taken along line

FIG. 6 is a cross-sectional view of the diode 600 shown in FIG. 5 taken along line I-I. The diode 600 includes first active layer 615 and second active layer 620, which in this example are formed from GaN and AlGaN, respectively. The first and second active layers are formed on substrate 610. FIG. 6 also illustrates one of the Shottky anode fingers 630 located below in contact with the anode pad 640. Also visible are adjacent ohmic cathode fingers 625, which are also located below the anode pad 640. The ohmic cathode fingers 625 are electrically isolated from the Schottky anode fingers 630 and the anode pad 640 by the dielectric layer 645.

Figure 7:
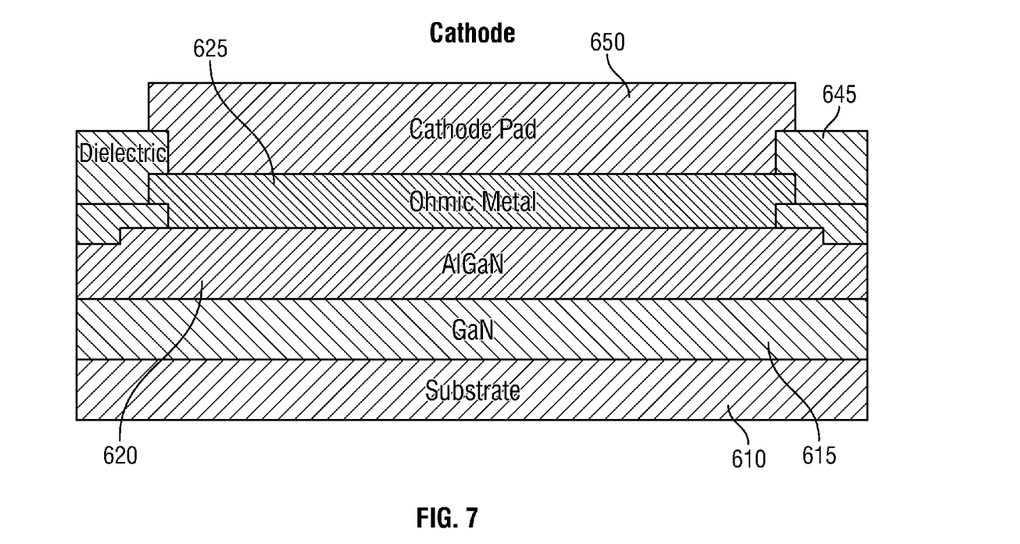
FIG. 7 is a cross-sectional view of the diode shown in FIG. 5 taken along line

FIG. 7 is a cross-sectional view of the diode 600 shown in FIG. 5 taken along line II-II, which illustrates the cathode pad 650 located above and in electrical contact with the distal ends of the ohmic cathode fingers where they come together with one another.

The diode 600 may be fabricated from many different material systems. For example, the diode 600 is fabricated using a Group-III nitride based material system. Group-III nitrides include the semiconductor compounds formed between nitrogen and the elements in Group-III of the periodic table, usually aluminum (Al), gallium (Ga), and indium (In). This group also includes ternary and tertiary compounds such as AlGaN and AlInGaN. For illustrative purposes the diodes described below are formed from GaN and AlGaN, although other Group-III nitrides may be employed as well.

The substrate 610 may be formed from various materials such as sapphire, silicon or silicon carbide. Various techniques of fabrication may employ one or more layers of materials to be disposed between the substrate 610 and the first active layer 615. For example, in some cases a buffer layer (not shown) may be formed on the substrate 610. The buffer layer may be formed from GaN, AlGaN, or aluminum nitride (AlN) and provides an interface from the non-GaN substrate to a GaN-based active structure. The buffer layer can reduce the defect concentration in the active device layers. The buffer layer may be considered as part of substrate 610, whereby the remaining layers as formed on buffer layer may be considered as device layers of the structure.

In the example described above, the first active layer 615 is comprised of gallium nitride (GaN). In other examples, different semiconductor materials containing nitride compounds of other elements from Group III of the Periodic Table of the Elements may comprise the first active layer 615.

The second active layer 620 in the example described above is comprised of aluminum gallium nitride (AlGaN). In other examples, different Group III nitride semiconductor materials such aluminum indium nitride (AlInN) and aluminum indium gallium nitride (AlInGaN) may comprise the second active layer 620. The material of the second active layer 620 may be a non-stoichiometric compound. In such materials, the ratios of the elements are not easily represented by ordinary whole numbers. For example, the second active layer 620 may be a non-stoichiometric compound of a Group III nitride semiconductor material such as $Al_XGa_{1-X}N$ where $0<X<1$.

As charge transfers from the second active layer 620 to the first active layer 615 because of the difference in bandgap between the materials, a planar region of high-charge, high mobility electrons is formed in the first active layer 615 at the interface between first and second active layers 615 and 620. The region of electric charge is sometimes called a two-dimensional electron gas because electrons confined in the quantum well that results from the polarization effects of the III-nitride hetero-structure are free to move in two dimensions but are tightly confined in the third dimension.

The amount of charge that transfers across the second active layer 620 to the first active layer 615 to form the electron gas depends on the thickness and material concentration (e.g., Al percent composition) of the second active layer 620, which initially determines the amount of electrons in electron gas. The AlGaN layer may be doped n-type, whereby the n-type dopant can be incorporated uniformly within second active layer 620, or in part of the layer only. The n-type dopant impurity in the AlGaN layer may be silicon, for example.

The electrodes 630 and 625 are disposed on the device and establish electrical connections to the active layers. In particular, the cathode 625 establishes an ohmic junction with the second active layer 620 and may be formed from any suitable metal.

The anode 630 establishes a Schottky junction with the second active layer 620. The anode 630 may be formed from any suitable pairs of materials for establishing a Schottky junction such as a metal or metalgallicide. Suitable metals may include nickel (Ni), platinum (Pt), titanium (Ti) and gold (Au).

The diode described herein may be fabricated using an epitaxial growth process. For instance, a reactive sputtering process may be used where the metallic constituents of the semiconductor, such as gallium, aluminum and/or indium, are dislodged from a metallic target disposed in close proximity to the substrate while both the target and the substrate are in a gaseous atmosphere that includes nitrogen and one or more dopants. Alternatively, metal organic chemical vapor deposition (MOCVD) may be employed, wherein the substrate is exposed to an atmosphere containing organic compounds of the metals as well as to a reactive nitrogen-containing gas, such as ammonia, and a dopant-containing gas while the substrate is maintained at an elevated temperature, typically around 700-1100 C. The gaseous compounds decompose and form a doped semiconductor in the form of a film of crystalline material on the surface of the substrate. The substrate and the grown film are then cooled. As a further alternative, other epitaxial growth methods, such as molecular beam epitaxy (MBE) or atomic layer epitaxy may be used. Yet additional techniques that may be employed include, without limitation, Flow Modulation Organometallic Vapor Phase Epitaxy (FM-OMVPE), Organometallic Vapor-Phase Epitaxy (OMVPE), Hydride Vapor-Phase Epitaxy (HVPE), and Physical Vapor Deposition (PVD). Standard metallization techniques, as known in the art of semiconductor fabrication, can be used to form the electrodes.

Figure 8:
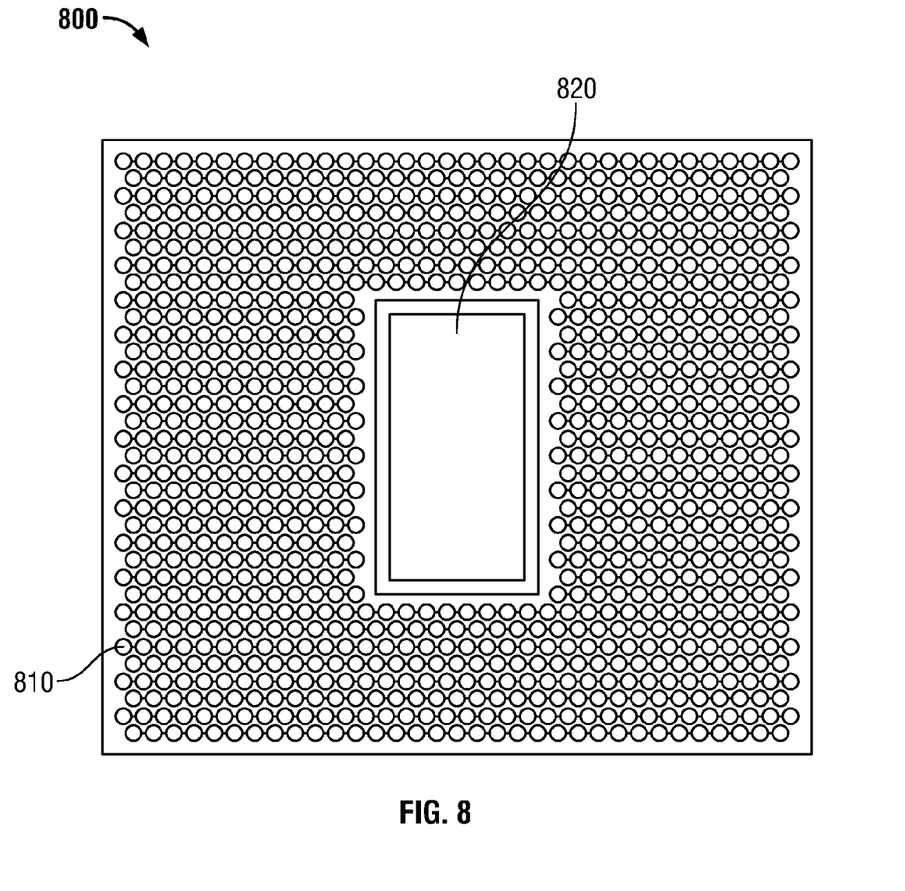
FIG. 8 shows a plan view of a GaN-based Schottky diode that employs circular Schottky electrodes.

The above examples and disclosure are intended to be illustrative and not exhaustive. These examples and description will suggest many variations and alternatives to one of ordinary skill in this art. For example, the cathode pad does need not be rectangular in shape. Rather, it may have a wide variety of alternative shapes including, without limitation, circular or oval shapes. In addition, the Schottky electrode need not be rectangular or striped in shape, as shown above. Rather, it may have a wide variety of alternative shapes including, without limitation, circular hexagonal or other shapes that do not include acute angles. These Schottky electrodes can be uniformly distributed around the cathode with an even distance between one another. Alternatively, the Schottky electrodes may be loosely arranged around the cathode edge to avoid current crowding. The Schottky electrodes may be aligned in the direction to achieve the shortest carrier transport route. An example of a device 800 with circular Schottky electrodes 810 surrounding anode pad 820 is illustrated in FIG. 8.

The aforementioned alternatives and variations are intended to be included within the scope of the attached claims. Those familiar with the art may recognize other equivalents to the specific embodiments described herein which equivalents are also intended to be encompassed by the claims attached hereto.

The invention claimed is:

1. A semiconductor device, comprising:
a substrate;
a first active layer disposed over the substrate;
a second active layer disposed on the first active layer, the second active layer having a higher bandgap than the first active layer such that a two-dimensional electron gas layer arises between the first active layer and the second active layer;
a first electrode establishing a Schottky junction with the second active layer, the first electrode including a first electrode pad and a first series of fingers in electrical contact with the first electrode pad; and
a second electrode establishing an ohmic junction with the first active layer, the second electrode including a second electrode pad and a second series of fingers being in electrical contact with the second electrode pad, the first and second series of electrode fingers forming an interdigitated pattern and the first electrode pad being located over the first and second series of electrode fingers.

2. The semiconductor device of claim 1, further comprising a dielectric layer located between the first electrode pad and the second series of fingers.

3. The semiconductor device of claim 1, wherein the second electrode pad is located over a portion of the second series of fingers that does not form the interdigitated pattern with the first series of fingers.

4. The semiconductor device of claim 1, wherein the second electrode pad is surrounded by the first electrode pad.

5. The semiconductor device of claim 1, wherein the first and second series of electrode fingers each include first and second electrode portions that are spaced apart from one another, the first electrode portions of the first and second series of electrode fingers forming a first interdigitated pattern and the second electrode portions of the first and second series of electrode fingers forming a second interdigitated pattern spatially separated from the first interdigitated pattern.

6. The semiconductor device of claim 1, wherein the first active layer comprises a group III nitride semiconductor material.

7. The semiconductor device of claim 6, wherein the first active layer comprises GaN.

8. The semiconductor device of claim 1, wherein the second active layer comprises a group III nitride semiconductor material.

9. The semiconductor device of claim 8, wherein the second active layer comprises $Al_xGa_{1-x}N$, wherein $0<X<1$.

10. The semiconductor device of claim 9, wherein the second active layer is selected from the group consisting of AlGaN, AlInN, and AlInGaN.

11. A semiconductor device, comprising:
a substrate;
a first active layer disposed over the substrate;
a second active layer disposed on the first active layer, the second active layer having a higher bandgap than the first active layer such that a two-dimensional electron gas layer arises between the first active layer and the second active layer;
a first electrode establishing a Schottky junction with the second active layer, the first electrode including a first electrode pad and a first plurality of electrodes in electrical contact with the first electrode pad; and
a second electrode establishing an ohmic junction with the first active layer, the second electrode including a second electrode pad and a second plurality of electrodes being in electrical contact with the second electrode pad, the first electrode pad being located over the first and second plurality of electrodes.

12. The semiconductor device of claim 11, wherein each of the first plurality of electrodes are circular in shape.

13. The semiconductor device of claim 11, wherein at least one electrode in the first plurality of electrodes is rectangular in shape.

14. The semiconductor device of claim 1, wherein each of the first plurality of electrodes are hexagonal in shape.

\* \* \* \* \*